United States Patent [19]
Tokami

[11] Patent Number: 5,304,857
[45] Date of Patent: Apr. 19, 1994

[54] PULSE GENERATING CIRCUIT FOR SEMICONDUCTOR DEVICE

[75] Inventor: Kenji Tokami, Hyogo, Japan

[73] Assignee: Mitsubishi Denki Kabushiki Kaisha, Tokyo, Japan

[21] Appl. No.: 9,178

[22] Filed: Jan. 26, 1993

[30] Foreign Application Priority Data

Jan. 31, 1992 [JP] Japan ............................. 4-16362

[51] Int. Cl.[5] ..................... H03K 3/284; H03K 3/355
[52] U.S. Cl. ................................ 307/273; 307/265; 307/279; 307/593
[58] Field of Search ............. 307/261, 265, 266, 268, 307/271, 273, 593, 291, 279; 328/58

[56] References Cited

U.S. PATENT DOCUMENTS

| | | | |
|---|---|---|---|
| 3,331,032 | 4/1967 | Miller | 307/273 |
| 3,668,423 | 6/1972 | Couch | 307/273 |
| 4,370,569 | 1/1983 | Hunsinger | 307/266 |
| 4,808,840 | 2/1989 | Chung et al. | 307/265 |

FOREIGN PATENT DOCUMENTS

424249A2  4/1991  European Pat. Off. .
62-202616  9/1987  Japan .

Primary Examiner—William L. Sikes
Assistant Examiner—Shawn Riley
Attorney, Agent, or Firm—Lowe, Price, LeBlanc & Becker

[57] ABSTRACT

The present invention is directed to a pulse generating circuit for use in a semiconductor device, in which P type MOS transistors are connected in parallel, series connected N type MOS transistors are connected in series to the P type MOS transistors in a parallel manner, the potential of a node is provided to the P type MOS transistor and the N type MOS transistors, while the potential of a node is provided to the P type MOS transistor and the N type MOS transistors, so that a one shot pulse having a substantially identical waveform can be generated either when an input clock $\phi_{IN}$ changes its level from an "H" level to an "L" level or from the "L" level to the "H" level.

5 Claims, 5 Drawing Sheets

PULSE GENERATING CIRCUIT FOR SEMICONDUCTOR DEVICE

BACKGROUND OF THE INVENTION

1. Field of the Invention

The present invention relates to pulse generating circuits for use in semiconductor devices, and to a pulse generating circuit for use in a semiconductor device for generating a one shot pulse in accordance with change in the level of an address signal, such as an ATD circuit provided in a DRAM.

2. Description of the Background Art

FIG. 3 is a schematic block diagram showing a conventional DRAM. In FIG. 3, a row address is input into a row address buffer 21, and the input row address is decoded by a row decoder 22 to be applied to a memory cell array 23. When a RAS signal is applied to a control circuit 28, a row address of the memory cell array 23 is designated in the timing of the RAS signal. Meanwhile, a column address is externally input into a column address buffer 24 and applied to a column decoder 25, and an OR output of each address is applied to ATD circuit 27. The ATD circuit 27 upon detecting a change in the level of an address signal, generates a one shot pulse as an internal CAS signal and applies the same to the column decoder 25. The column decoder 25 decodes a column address signal and designates a column address of the memory cell array 23 through a sense amplifier 26. Externally input data is applied from an I/0 29 to the memory cell array 23 through the sense amplifier 26. If a R/W signal applied to the control circuit 28 indicates a state of writing, the data is written into a designated address of the memory cell array 23. If the R/W signal indicates a state of reading, an address of the memory cell array 23 is designated by a row address signal and a column address signal, data is read out from a corresponding address, and the read out data is amplified at the sense amplifier 26 and then output through the I/0 29.

FIG. 4 is a diagram of an electrical circuit showing one example of the ATD circuit shown in FIG. 3. Referring to FIG. 4, an address signal, for example, is input as a clock input $\phi_{IN}$. The clock input $\phi_{IN}$ is input to the gate of a P type MOS transistor 2 and the gates of N type MOS transistors 8 and 10, and inverted at an inverter 1 to be applied as $\overline{\phi_{IN}}$ to the gate of N type MOS transistor 5 and the gates of N type MOS transistors 12 and 14. A P type MOS transistor 3 is connected in parallel to a P type MOS transistor 2, a power supply voltage $V_{cc}$ is provided to the drains of the P type MOS transistors 2 and 3, the sources of the P type MOS transistors 2 and 3 are connected to the drain of the N type MOS transistor 8, an N type MOS transistor 9 is connected between the source of the N type MOS transistor 8 and the drain of the N type MOS transistor 10, and an N type MOS transistor 11 is connected between the source of the N type MOS transistor 10 and ground. Each gate of the P type MOS transistor 3 and the N type MOS transistors 9 and 11 is connected to a node N1.

A P type MOS transistor 4 is connected in parallel to a P type MOS transistor 5, a power supply voltage $V_{cc}$ is provided to the drains of the P type MOS transistors 4 and 5, the sources of the P type MOS transistors 4 and 5 are connected to the drain of an N type MOS transistor 12, an N type MOS transistor 13 is connected between the source of the N type MOS transistor 12 and the drain of the N type MOS transistor 14, and an N type MOS transistor 15 is connected between the source of the N type MOS transistor 14 and ground. Each gate of the P type MOS transistor 4, the N type MOS transistors 13 and 15 is connected to a node N2. The node N1 is connected to the connection point of the sources of the P type MOS transistors 4 and 5 and the drain of N type MOS transistor 12, while the node N2 is connected to the connection point of the sources of the P type MOS transistors 2 and 3 and the drain of the N type MOS transistor 8.

The gates of the P type MOS transistors 7 and 6 constituting a 2-input NAND circuit are connected to the nodes N1 and N2. The drains of the P type MOS transistors 6 and 7 are each provided with the power supply voltage $V_{cc}$, the sources are connected together to be output as $\phi_{OUT}$ and also connected to the drain of an N type MOS transistor 17, the source of the N type MOS transistor 16 is connected to the drain of the N type MOS transistor 17, and the source of the N type MOS transistor 17 is grounded. The gate of the N type MOS transistor 16 is connected to the node N1, while the gate of the N type MOS transistor 17 is connected to the node N2.

FIG. 5 is a timing chart for use in illustration of an operation of the ATD circuit shown in FIG. 4. Now, referring to FIG. 5, a description of the operation of the ATD circuit shown in FIG. 4 follows. The N type MOS transistors 8–11 and 12–15 function as high resistance elements. As shown in FIG. 5(a), when the clock input $\phi_{IN}$ rises to an "H" level, the P type MOS transistor 2 is turned off, the N type MOS transistors 8 and 10 conduct, and $\overline{\phi_{IN}}$ which is an output of the inverter 1 is pulled down to an "L" level. Accordingly, the P type MOS transistor 5 conducts, while the N type MOS transistors 12 and 14 are turned off. As a result, the node N1 is pulled to the "H" level, while the N type MOS transistors 9 and 11 conduct.

With the P type MOS transistors 2 and 3 being nonconductive, the node N2 attains the "L" level as shown in FIG. 5(d). At that time, as shown in FIG. 5(c), the node N2 rapidly rises from the "L" level to the "H" level, while the node N2 is pulled down to the "L" level from the "H" level gradually as shown in FIG. 5(d), since the N type MOS transistors 8–11 function as the high resistance elements. Therefore, the P type MOS transistor 7 has conducted before the node N1 rises to the "H" level, while the P type MOS transistor 6 conducts when the node N2 is pulled down to the "L" level. Therefore as shown in FIG. 5(e), a one shot pulse by which the sources of the P type MOS transistors 6 and 7 attain the "L" level only during a period T1 is output as $\phi_{OUT}$.

Conversely, when the clock input $\phi_{IN}$ is pulled from the "H" level to the "L" level, the node N2 rapidly rises to the "H" level from the "L" level, and the node N1 is gradually pulled to the "L" level from the "H" level. As a result, a one shot pulse which attains the "L" level only during a period T2 is output as $\phi_{OUT}$.

In the ATD circuit show in FIG. 4, as described above, it takes a longer period of time for $\phi_{OUT}$ to change its level from "L" to "H" in the case in which the node N2 changes its level from "H" to "L" as compared to the case in which the node N1 changes its level from the "H" to "L", resulting in different one shot pulse widths between T1 and T2. Accordingly, the ATD circuit shown in FIG. 4 suffers from a disadvantage that accessing time varies depending upon change in address when used for an SRAM or a DRAM.

SUMMARY OF THE INVENTION

It is therefore a main object of the present invention to provide a pulse generating circuit for use in a semiconductor device allowing generation of a one shot pulse having the same pulse width if the logic level of an input signal changes in any way.

More simply stated, according to the invention, first and second transistors of first type conductivity are connected in parallel, third and fourth transistors of second type conductivity are connected in series, fifth and sixth transistors of the second type conductivity are connected in series, and these series-connected third and fourth transistors and fifth and sixth transistors are connected to the first and second transistors in a parallel manner, while the potential of a first node and the potential of a second node are symmetrically input into the first, third and fifth transistors and the second, fourth and sixth transistors, respectively.

Therefore, according to the present invention, even if the potentials of first and second nodes change from a first logic to a second logic or from the second logic to the first logic, the same condition is given for the third to sixth transistor to become non-conductive, and one shot pulses having a substantially identical waveform can be generated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
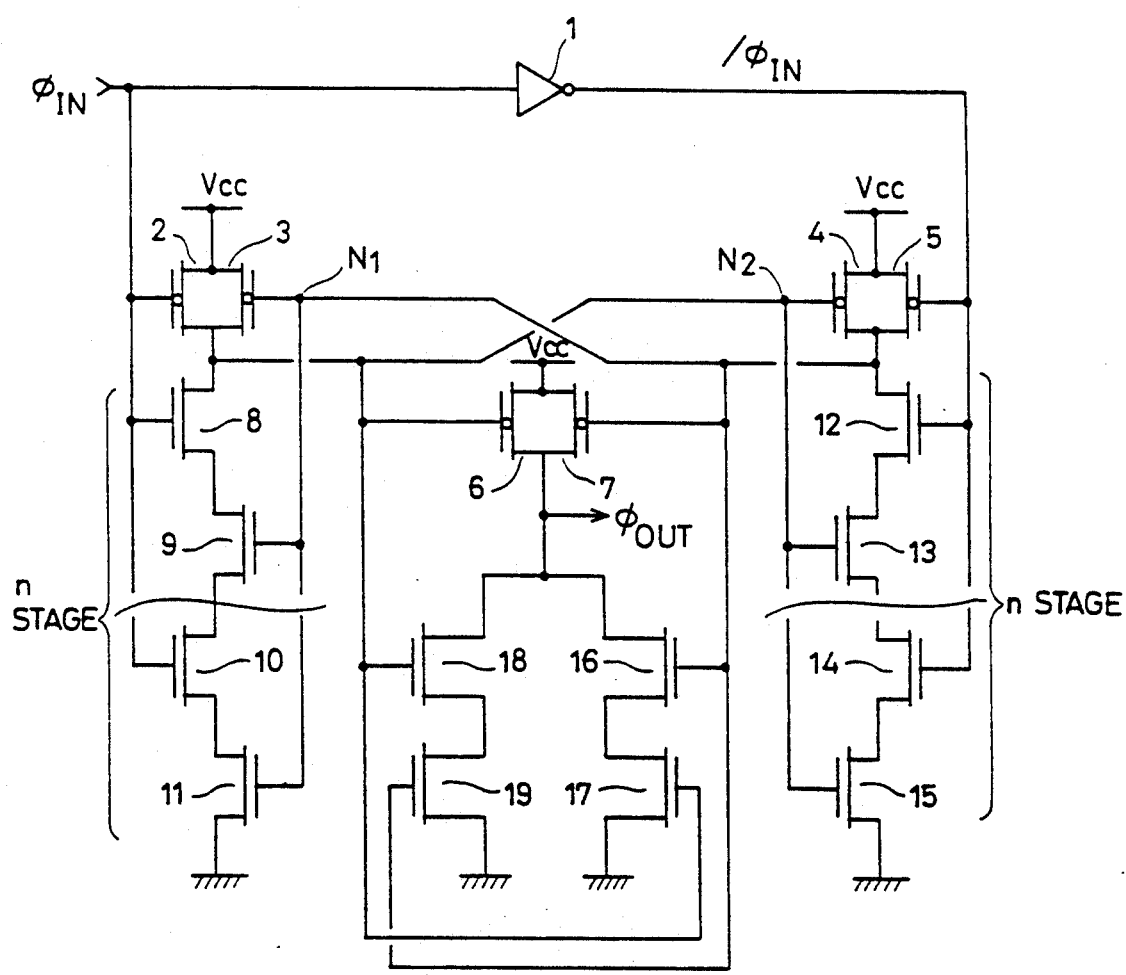
FIG. 1 is a diagram of an electrical circuit in accordance with one embodiment of the present invention.
Figure 4:
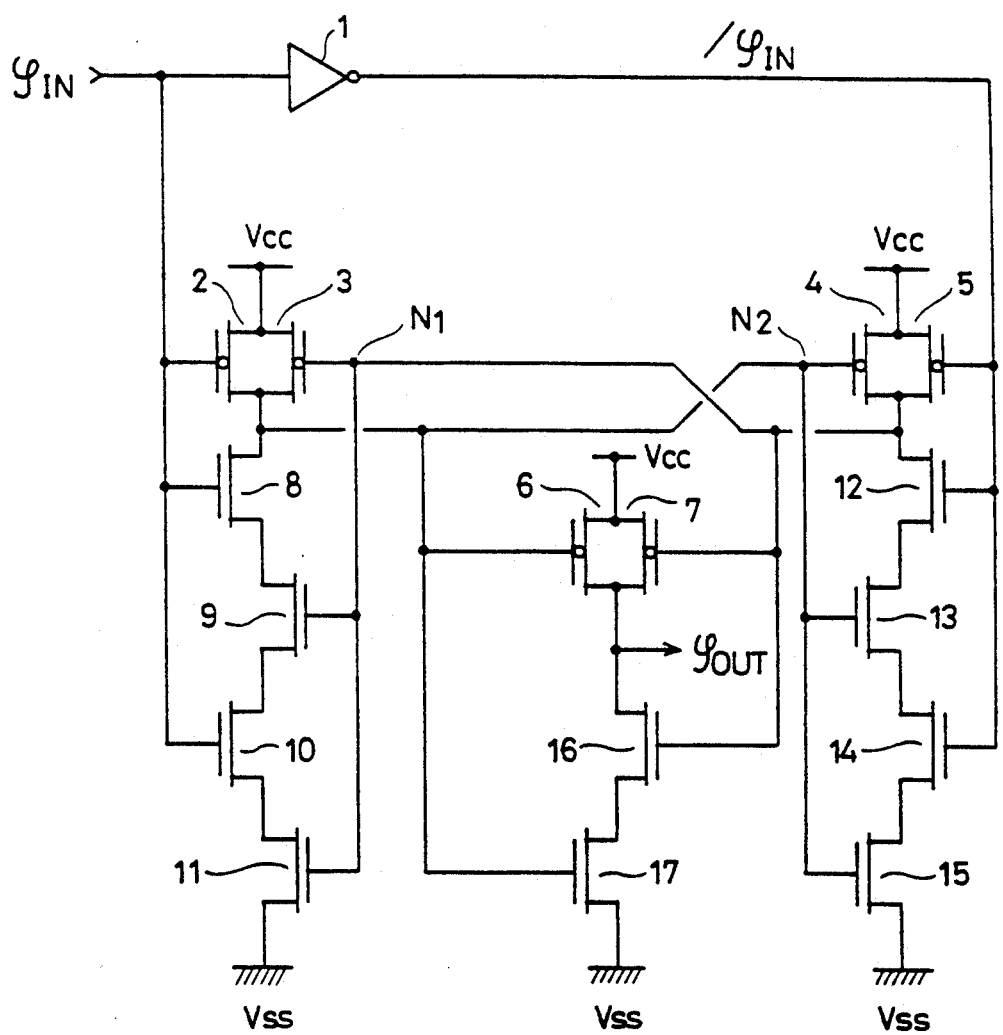
FIG. 4 is a diagram of an electrical circuit showing a conventional ATD circuit.
Figure 5:
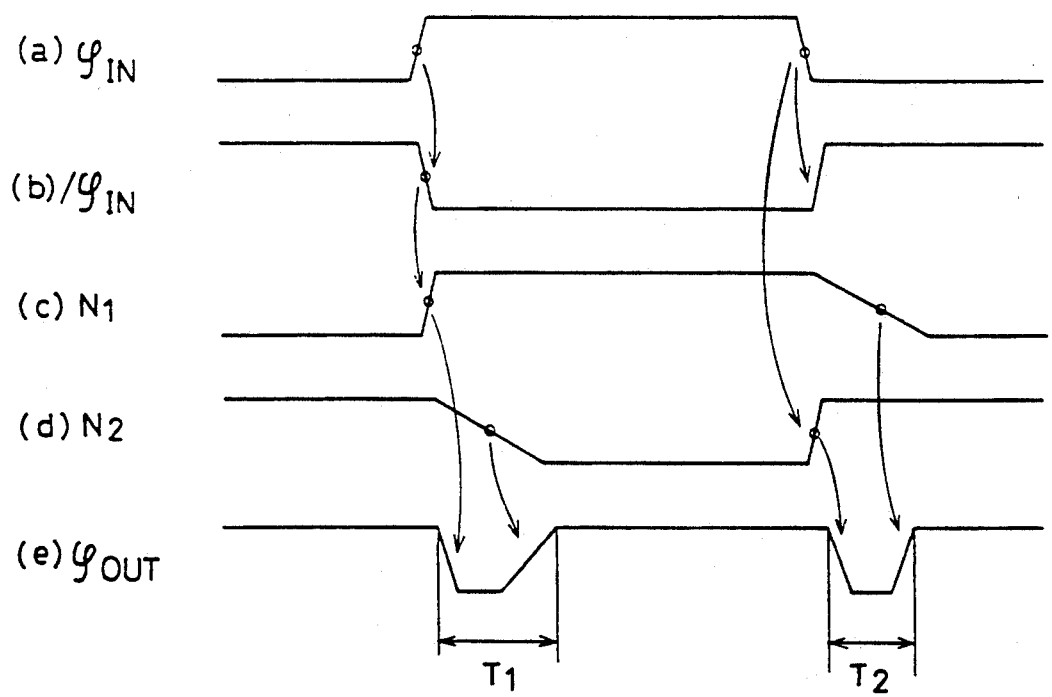
FIG. 5 is a timing chart for use in illustration of an operation of the ATD circuit shown in FIG. 4.

FIG. 1 is a diagram of an electrical circuit in accordance with one embodiment of the present invention. The embodiment shown in FIG. 1 is configured in the same manner as that described in conjunction with FIG. 4 except for the following points. That is, a series circuit of the N type MOS transistors 16 and 17, and a series circuit of the N type MOS transistors 18 and 19 are connected in parallel between the sources of the P type MOS transistors 6 and 7 and ground. The sources of the N type MOS transistors 17 and 19 are grounded, the gate of the N type MOS transistor 16 and the gate of the N type MOS transistor 19 are connected to the node N1, and the gate of the N type MOS transistor 17 and the gate of the N type MOS transistor 18 are connected to the node N2.

Figure 2:
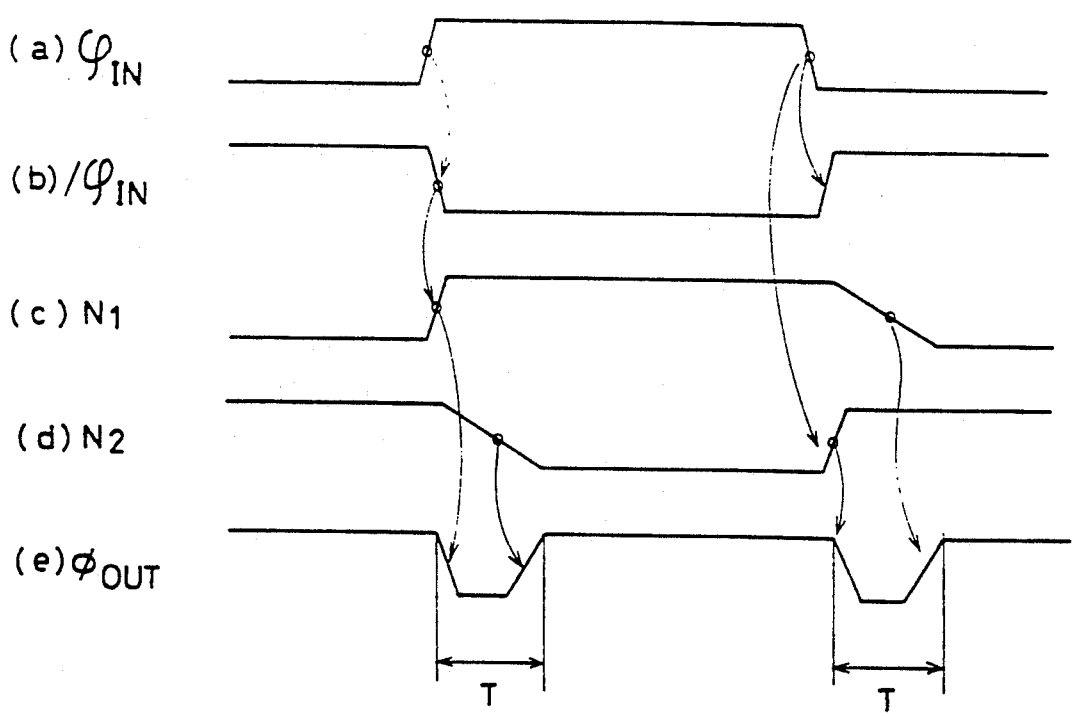
FIG. 2 is a timing chart for use in illustration of an operation of the ATD circuit shown in FIG. 1.
Figure 3:
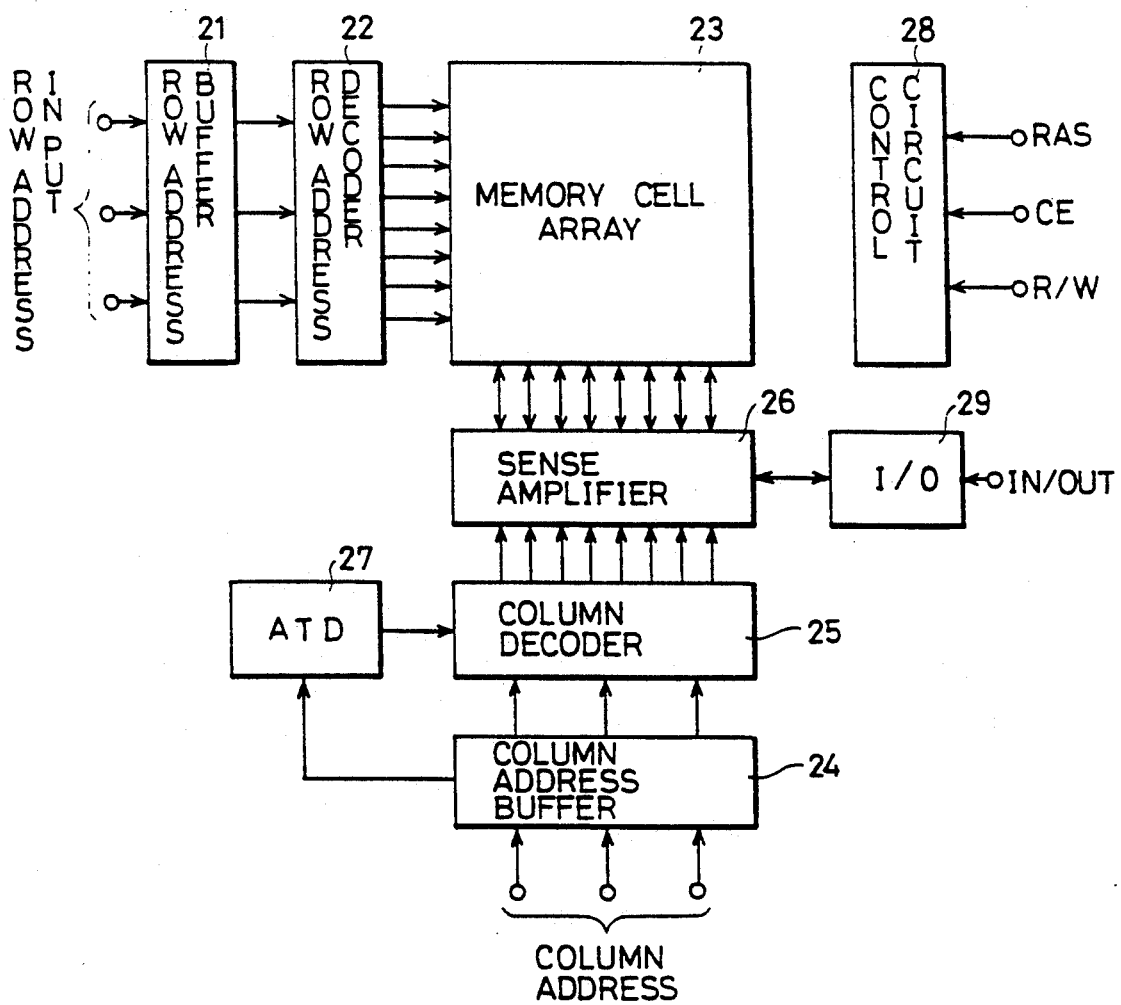
FIG. 3 is a schematic block diagram showing a conventional DRAM.

FIG. 2 is a timing chart for use in illustration of an operation of the embodiment of the present invention. Now, referring to FIG. 2, a description of an operation of the ATD circuit shown in FIG. 1 follows. When a clock input $\phi_{IN}$ is pulled from an "L" level to an "H" level as shown in FIG. 2(a), the node N1 is rapidly pulled to the "H" level and the node N2 is gradually pulled to the "L" level in the same manner as described in conjunction with FIG. 4. The P type MOS transistor 7 is turned off at a certain threshold value level when the node N1 is pulled from the "L" level to the "H" level, and at the same time the N type MOS transistors 16 and 19 conduct. Meanwhile, at a certain threshold value level when the node N2 is pulled from the "H" level to the "L" level the N type MOS transistors 17 and 18 attain a conduction state from a non-conduction state, and at the same time the P type MOS transistor 6 conducts. Therefore, a one shot pulse signal having a pulse width of T is output as $\phi_{OUT}$ from the sources of the P type MOS transistors 6 and 7.

Similarly, when the clock input $\phi_{IN}$ is pulled down from the "H" level to the "L", the node N1 is gradually pulled from the "H" level to the "L" level as shown in FIG. 2(c), while the node N2 is rapidly pulled from the "L" level to the "H" level as shown in FIG. 2(d). The P type MOS transistor 6 is turned off at a certain threshold value level when the node N2 is pulled from the "L" level to the "H" level, while the N type MOS transistors 17 and 18 conduct, with the $\phi_{OUT}$ being pulled to the "L" level as shown in FIG. 2(e). Meanwhile, the P type MOS transistor 7 attains a conduction state from a non-conduction state at a certain threshold value level when the node N1 is pulled from the "H" level to the "L" level, while the N type MOS transistors 16 and 19 are turned off from a conduction state, the $\phi_{OUT}$ rises to the "H" level, and a one shot pulse signal having a pulse width of T is output as the $\phi_{OUT}$.

As described above, according to the present embodiment, since the signals of the nodes N1 and N2 are symmetrically input to the respective gates of the P type MOS transistors 6 and 7 and the N type MOS transistors 16–19 constituting the NAND circuit, the N type MOS transistors 16–19 are turned off on the same condition even if either of the signals of the nodes N1 and N2 changes its level from "H" to "L". Accordingly, a one shot pulse $\phi_{OUT}$ having the same width is generated whether the clock input $\phi_{IN}$ changes from the "L" level to the "H" level or from "H" level to "L" level.

In the embodiment shown in FIG. 1, four N type MOS transistors 8–11 are connected in series to the P type MOS transistors 2 and 3, while four N type MOS transistors 12–15 are connected in series to the P type MOS transistors 4 and 5, but these N type MOS transistors can be set in an arbitrary number of stages (n stages).

As described above, according to the embodiment of the present invention, first and second transistors of first type conductivity are connected in parallel, series-connected third and fourth transistors and fifth and sixth transistors of second type conductivity are connected in series to the first and second transistors in a parallel manner, the potential of the first node and the potential of the second node are symmetrically input into the third and fifth transistors, and the second, fourth and sixth transistors, respectively, and, therefore, a one shot pulse having a substantially identical waveform can be generated when an input signal changes its level from a first logic to a second logic or from the second logic to the first logic.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A pulse generating circuit for use in a semiconductor device responsive to change in the level of an input signal for generating a one shot pulse, comprising:
   a first switching circuit responsive to an input signal for switching a first node to a first logic level;
   a second switching circuit responsive to an inverted signal of said input signal for switching a second node to a second logic level;
   a first transistor of first type conductivity having its input electrode connected to said first node and its first electrode provided with a first reference potential;
   a second transistor of the first type conductivity having its input electrode connected to said second node, its first electrode provided with said first reference potential, and its second electrode connected to a second electrode of said first transistor, for generating said one shot pulse from said second electrode;
   a third transistor of second type conductivity having its input electrode connected to said first node and its first electrode connected to the second electrodes of said first and second transistors;
   a fourth transistor of the second type conductivity having its input electrode connected to said second node and its first electrode connected to the second electrodes of said first and second transistors;
   a fifth transistor of the second type conductivity having its input electrode connected to said first node, its first electrode connected to a second electrode of said fourth transistor, and its second electrode connected to the second reference potential; and
   a sixth transistor of the second type conductivity having its input electrode connected to said second node, its first electrode connected to a second electrode of said third transistor, and its second electrode connected to said second reference potential.

2. A pulse generating circuit for use in a semiconductor device as recited in claim 1, further comprising:
   a first high resistance element connected between said first node and said second reference potential; and
   a second high resistance element connected between said second node and said second reference potential.

3. A pulse generating circuit for use in a semiconductor device as recited in claim 2, wherein
   said first high resistance element includes a plurality of transistors of the second type conductivity each connected in series, and
   said second high resistance element includes a plurality of transistors of the second type conductivity each connected in series.

4. A pulse generating circuit for use in a semiconductor device as recited in claim 1, wherein
   said first switching circuit includes,
   a seventh transistor of the first type conductivity having its input electrode provided with said input signal, its first electrode connected to said first reference potential, and its second electrode connected to said first node, and
   an eight transistor of the first type conductivity having its input electrode connected to said second node, its first electrode connected to said first reference potential, and its second electrode connected to the second electrode of said seventh transistor.

5. A pulse generating circuit for use in a semiconductor device as recited in claim 1, wherein
   said second switching circuit includes,
   a ninth transistor of the first type conductivity having its input electrode provided with an inverted signal of said input signal, its first electrode connected to said first reference potential, and its second electrode connected to said second node, and
   a tenth transistor of the first type conductivity having its input electrode connected to said first node, its first electrode connected to said first reference potential, and its second electrode connected to the second electrode of said ninth transistor.

* * * * *